United States Patent [19]
Imai et al.

[11] Patent Number: 5,329,208
[45] Date of Patent: Jul. 12, 1994

[54] SURFACE ACOUSTIC WAVE DEVICE AND METHOD FOR PRODUCING THE SAME

[75] Inventors: Takahiro Imai; Hideaki Nakahata; Akihiro Hachigo; Naoji Fujimori, all of Itami, Japan

[73] Assignee: Sumitomo Electric Industries, Ltd., Osaka, Japan

[21] Appl. No.: 894,598

[22] Filed: Jun. 5, 1992

[30] Foreign Application Priority Data

Jun. 5, 1991 [JP] Japan .................................. 3-134239

[51] Int. Cl.⁵ .............................................. H01L 41/18
[52] U.S. Cl. ............................ 310/313 R; 310/313 A
[58] Field of Search ....................... 310/313 A, 313 R

[56] References Cited

U.S. PATENT DOCUMENTS

| | | | |
|---|---|---|---|
| 4,025,954 | 5/1977 | Bert | 310/313 R |
| 4,817,102 | 3/1989 | Maurer et al. | 372/45 |
| 4,952,832 | 8/1990 | Imai et al. | 310/313 A |
| 4,978,879 | 12/1990 | Satoh et al. | 310/313 A |
| 5,061,870 | 10/1991 | Ieki et al. | 310/313 A |
| 5,160,869 | 11/1992 | Nakahata et al. | 310/313 A |

FOREIGN PATENT DOCUMENTS

| | | | |
|---|---|---|---|
| 50-154088 | 12/1975 | Japan | H04R 17/00 |
| 58-91100 | 5/1983 | Japan | C30B 29/04 |
| 58-110494 | 7/1983 | Japan | C30B 29/04 |
| 58-135117 | 8/1983 | Japan | C01B 31/06 |
| 61-251158 | 11/1986 | Japan | H01L 23/36 |
| 64-20714 | 1/1989 | Japan | H03H 9/145 |
| 64-62911 | 3/1989 | Japan | H03H 9/25 |

Primary Examiner—Thomas M. Dougherty
Attorney, Agent, or Firm—Cushman, Darby & Cushman

[57] ABSTRACT

A surface acoustic wave device having a diamond layer, a piezoelectric layer and a comb-like electrode, in which the piezoelectric layer and the comb-like electrode are formed on a surface of the diamond layer, which surface has been contacted to a substrate used in the formation of the diamond layer by a vapor phase growth method, which device has high stability and can be produced economically.

6 Claims, 2 Drawing Sheets

$\lambda = 4d$ $\lambda_1 = \frac{8}{3}d$

SURFACE ACOUSTIC WAVE DEVICE AND METHOD FOR PRODUCING THE SAME

BACKGROUND OF THE INVENTION

1. Field of the Invention

The present invention relates to a highly stable surface acoustic wave device which operates in a high frequency range and is produced economically.

2. Description of the Related Art

Surface acoustic wave devices utilize a surface acoustic wave which propagates with energy concentrated on a surface of a solid material. As they are compact and stable device, they are often used as an intermediate frequency filter in a TV set and the like.

The surface acoustic wave device is usually excited by applying an alternating electric field on a piezoelectric material with comb-like electrodes.

Piezoelectric material often used to form such devices include bulk single crystals such as quartz crystal, $LiNbO_3$, $LiTaO_3$, etc. or a ZnO thin film which is vapor deposited on a substrate.

In general, an operation frequency f of the surface acoustic wave device is determined by the equation:

$$f = v/\lambda$$

in which v is a propagation velocity of the surface acoustic wave and $\lambda$ is a wavelength. The wavelength $\lambda$ is determined from a period of the comb-like electrode as shown in FIGS. 1 and 2. In FIG. 1, electrode tips each having a width d are integrally formed with a distance 3d. A pair of adjacent electrode tips comprise different electrodes and every other electrode tips comprise the same electrodes. The comb-like electrode of FIG. 1 is one of the most commonly used electrodes. The wavelength with this type of electrodes is 4d.

In the comb-like electrode of FIG. 2, two electrode tips each having a width d are repeatedly arranged with a distance 5d. The wavelength $\lambda$ is 8d/3. With the comb-like electrode of FIG. 2, a three-times mode is strongly excited.

The propagation velocity v depends on the piezoelectric material or the substrate material and also on the mode of surface acoustic wave.

When the single crystal piezoelectric material made of $LiNbO_3$ is used, the propagation velocity v ranges from 3500 to 4000 m/sec., and when $LiTaO_3$ material is used, the propagation velocity v ranges 3300 to 3400 m/sec. When the piezoelectric material comprising the ZnO thin film formed on the glass plate is used, the propagation velocity v is at most 3000 m/sec.

To increase the operation frequency f, the propagation velocity v is increased and/or the wavelength $\lambda$ is decreased. However, the propagation velocity v is limited by the characteristics of the material. The period size of the comb-like electrode has a lower limit due to limitations in the processing technique. By photolithography, the lower limit of the period size is set at 0.8 $\mu$m. With an electron beam exposure, the processing to a submicron order is possible. However, as the line width becomes smaller, the yield becomes worse. That is, because of the limitation of the processing technique, the wavelength $\lambda$ cannot be reduced significantly.

Due to the above reasons, the operation frequency of the practically used surface acoustic wave device is at most 900 MHz.

By the way, as the frequency in a telecommunication, is increased such as satellite telecommunication or mobile telecommunication, it is increasingly required to provide a surface acoustic wave device which can be used in a high frequency range (GHz band), and such surface acoustic wave devices are being developed vigorously.

In general, to apply the piezoelectric thin film grown on the substrate in the surface acoustic wave device, when the sound velocity through the substrate is larger than that through the piezoelectric material, plural surface acoustic waves having different propagation velocities (zeroth order mode, first order mode, second order mode and so on from the wave having the smaller propagation velocity) are generated.

When the sound velocity through the substrate material is larger, the propagation velocity v becomes larger.

A prototype device comprising a substrate of sapphire through which the sound velocity is large (a velocity of transversal wave: 6000 m/sec., a velocity of longitudinal wave: 12,000 m/sec.) and a ZnO piezoelectric thin film formed thereon was produced (cf. Japanese Patent Kokai Publication No. 154088/1975). This prototype device achieved the propagation velocity of 5500 m/sec.

Since the sound through diamond has the largest velocity (a velocity of transversal wave: 13,000 m/sec., a velocity of longitudinal wave: 16,000 m/sec.), a surface acoustic wave device comprising a diamond substrate will realize a propagation velocity of 10,000 m/sec. or larger. Since the sound velocity through a diamond-like carbon is substantially the same as that through the diamond, a device comprising a diamond-like carbon substrate will realize the same propagation velocity as in case of the device comprised of the diamond substrate. Such a device is described in Japanese Patent Kokai Publication Nos. 20714/1989 and 62911/1989).

As an example of a laminated structure consisting of a diamond layer, a piezoelectric layer and electrodes, a structure similar to FIG. 3 is contemplated, which may be prepared by growing a diamond film 2 on a substrate 1 such as a silicon plate by a vapor phase growth method, forming comb-like electrodes 4 and then forming a piezoelectric layer 3 such as a ZnO layer. Since the electrodes are formed at an interface between the diamond film through which the surface acoustic wave propagates at a high speed and the piezoelectric layer, the structure of FIG. 3 is advantageous because of low loss of signals. Usually, the diamond film grown by the vapor phase growth method has an irregularity of 10% or more in relation to a thickness of the diamond film.

To increase the propagation velocity of the surface acoustic wave through the diamond film to an inherent value for the diamond, a thickness of the diamond film should be the same as or larger than a wavelength of the surface acoustic wave. That is, the diamond film should have a thickness of 0.5 to 5 $\mu$m or larger for the surface acoustic wave device to be operated in a high frequency range of 1 GHz or higher. When the diamond film having such a thickness is formed by the vapor phase growth method, the as-grown diamond film has an irregularity of 0.2 to 5 $\mu$m.

Since the comb-like electrode formed on the diamond film consists of a precise pattern of a metal film having a thickness of 0.8 to 5.0 $\mu$m, a substrate on which the comb-like electrode is formed has preferably a surface roughness ($R_{max}$) of 0.1 $\mu$m or less in view of a production yield of the device. Therefore, the surface of the diamond film should be smoothened by, for example, abrasion before the formation of the comb-like electrode.

Since the diamond is extremely hard and such surface smoothening by abrasion is time and cost-consuming, a surface acoustic wave device comprised of diamond film has not been produced at a low production cost.

When a surface acoustic wave device has a structure of FIG. 4, since the piezoelectric layer 3 is formed on the diamond film 2, the layer 3 has substantially the same irregularity as the diamond film 2.

SUMMARY OF THE PRESENT INVENTION

One object of the present invention is to provide a surface acoustic wave device comprising a diamond layer having smaller irregularity on its surface on which a comb-like electrode or a piezoelectric layer is formed.

Another object of the present invention is to provide a method for producing a surface acoustic wave device of the present invention.

According to a first aspect of the present invention, there is provided a surface acoustic wave device comprising a diamond layer, a piezoelectric layer and a comb-like electrode, wherein said piezoelectric layer and said comb-like electrode are formed on a surface of said diamond layer, which surface has been contacted to a substrate used in the formation of said diamond layer by a vapor phase growth method.

According to a second aspect of the present invention, there is provided a method for producing a surface acoustic wave device comprising steps of:
  forming a diamond layer on a substrate by a vapor phase growth method,
  removing said substrate, and
  forming a piezoelectric layer and a comb-like electrode on a surface of said diamond layer which surface has been contacted to said substrate.

According to a third aspect of the present invention, there is provided a method for producing a surface acoustic wave device-comprising steps of:
  forming a diamond layer on a substrate by a vapor phase growth method,
  providing support means on a surface of said grown diamond layer,
  removing said substrate, and
  forming a piezoelectric layer and a comb-like electrode on a surface of said diamond layer which surface has been contacted to said substrate.

DETAILED DESCRIPTION OF THE DRAWINGS

Figure 1:
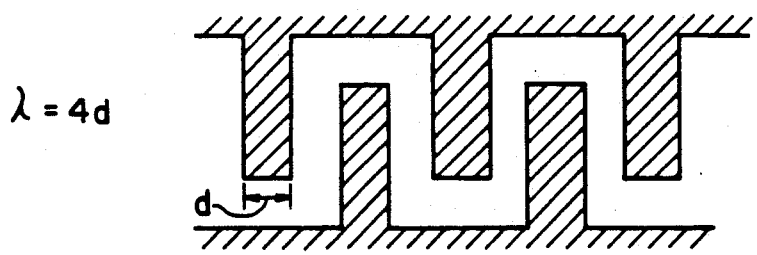
FIGS. 1 and 2 are plane views of two examples of comb-like electrodes.
Figure 2:
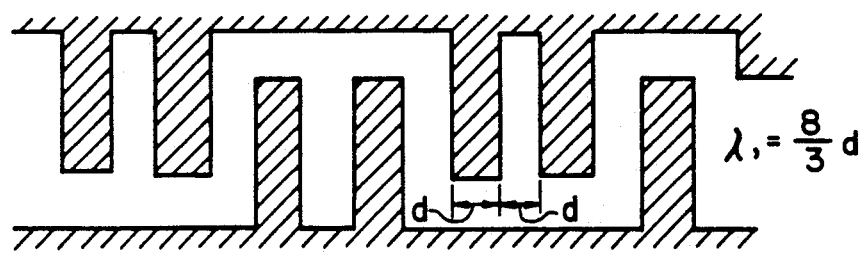
Figure 3:
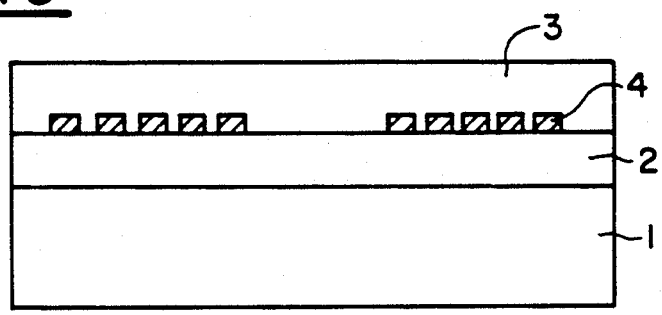
FIG. 3 schematically shows a cross section of one example of a conventional surface acoustic wave device, FIG. 4 schematically shows a cross section of another example of a conventional surface acoustic wave device, FIGS. 5, 6 and 7 schematically show cross sections of the surface acoustic wave devices according to the present invention.
Figure 4:
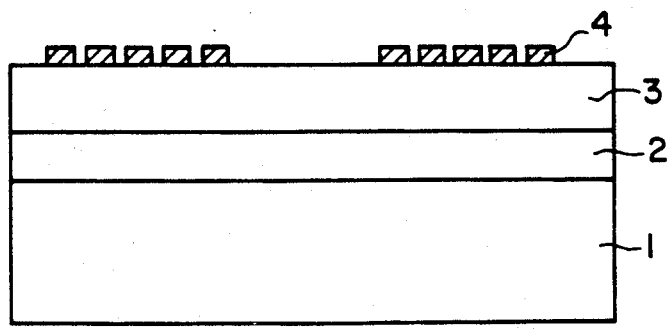

For a substrate on which the diamond layer is formed by the vapor phase growth method, a surface roughness ($R_{max}$) of 0.1 $\mu$m or less is preferred. According to the present invention, a surface of the diamond layer which is present at an interface between the substrate and the diamond layer has substantially the same roughness as that of the substrate surface. Since it is easy to process a surface of the substrate to a surface roughness of 0.02 $\mu$m or less, the substrate to be used according to the present invention has a surface roughness of 0.02 $\mu$m or less preferably.

Since the substrate should be removed after the formation of the diamond layer, a substrate material is preferably removed by an etching process, for example, dissolution with an acid, an alkali or other chemical materials. Preferred examples of the substrate material are semiconductive materials (e.g. Si, Ge, etc.) and metals (e.g. Mo, W, etc.). Also, oxides such as $SiO_2$ or oxide mixtures may be used.

In some cases, the substrate is flawed with an abrasive grain such as diamond grain to control a crystal size of the grown diamond. In such cases, the surface roughness of the flawed substrate is preferably 0.1 $\mu$m or less, and more preferably 0.02 $\mu$m or less.

Known vapor phase growth methods for the diamond layer including a thermal CVD (chemical vapor deposition) method (cf. Japanese Patent Kokai Publication No. 91100/1983), a plasma CVD method (cf. Japanese Patent Kokai Publication Nos. 135117/1983 and 110494/1983), an ion beam method, a laser CVD method and a combustion flame method. Among them, the thermal CVD method and the plasma CVD method are preferred in view of uniform growth of the diamond layer.

The diamond layer according to the present invention mainly comprises carbon atoms and contains at least partly crystalline diamond which is confirmed by X-ray diffraction, an electron beam diffraction or a Raman spectroscopy. The diamond layer may contain other carbonaceous materials such as graphite, amorphous carbon or diamond-like carbon. As a content of diamond in the diamond layer increases, a propagation velocity of the surface acoustic wave increases.

The diamond layer may contain, as an impurity, a minor amount of an element such as B, N, O, Al, Si, P, Ti, W, Ta, Fe, Ni and the like. When such an impurity element or the above non-diamond carbonaceous material is contained, the diamond layer preferably has a resistivity of at least $10^6$ $\Omega$.cm.

A thickness of the diamond layer is at least a half of a wavelength of the surface acoustic wave at a frequency of the surface acoustic wave device. In view of the strength of the diamond layer, the thickness of the diamond layer is preferably at least 5 $\mu$m, and more preferably from 10 to 100 $\mu$m.

Since strength of the diamond layer having the thickness of 100 $\mu$m or less, in particular 10 $\mu$m or less, may not be sufficient, its surface opposite to the surface on which the surface acoustic wave device is formed may be fixed to a support means by brazing or adhesion. In this case, the diamond layer is grown on the substrate of, for example, Mo, with the support means being fixed to the grown surface of the diamond layer by brazing and the like, and the substrate is removed from the diamond layer.

Examples of the piezoelectric material are ZnO, AlN, PZT, PLZT, $SiO_2$, $LiTaO_3$, $LiNbO_3$ and the like. In view of easiness of the formation of a c-axis orientated film, ZnO is preferred.

A thickness of the piezoelectric layer is usually at least 0.1 $\mu$m, preferably 0.2 to 7 $\mu$m.

The piezoelectric layer may be formed by any conventional vapor phase synthesis methods such as sputtering, CVD, reactive vapor deposition and the like. By these methods, the piezoelectric layer which has large piezoelectricity and good orientation in the c-axis is grown. When a degree of the c-axis orientation is too small or a resistivity of the piezoelectric layer is too small, an electromechanical coupling factor $K^2$ is small. Preferably, a degree $\alpha$ of the orientation which is calculated from an X-ray locking curve against the c-axis of ZnO is not larger than 3, and the resistivity is at least $10^4$ $\Omega$.cm.

Figure 5:
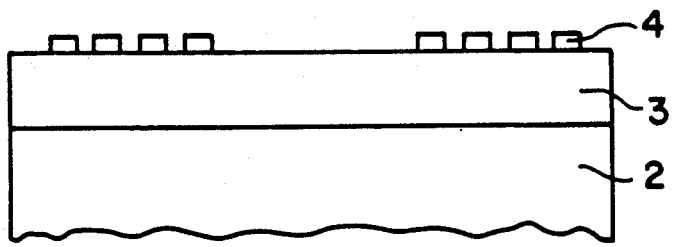
Figure 6:
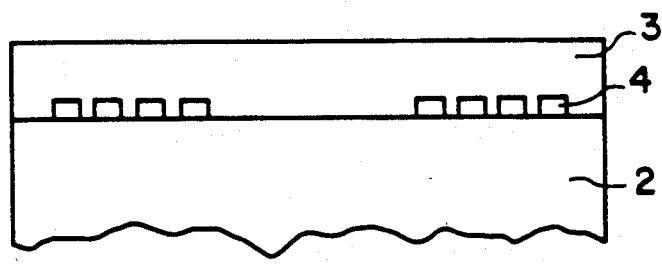
Figure 7:
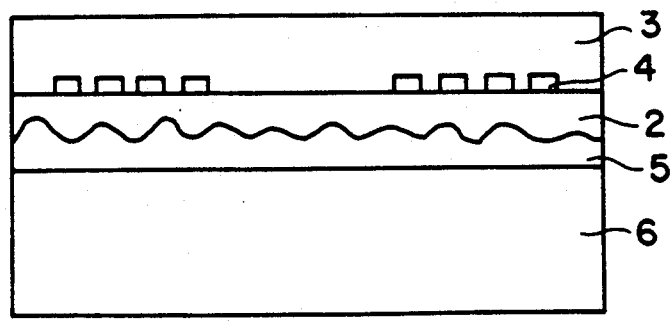

Three examples of the surface acoustic wave device according to the present invention are shown in FIGS. 5, 6 and 7.

In FIG. 5, the surface acoustic device comprises a diamond layer 2, a piezoelectric layer 3 and comb-like electrodes 4.

In FIG. 6, the comb-like electrodes 4 are sandwiched between the diamond layer 2 and the piezoelectric layer 3.

The embodiment of FIG. 7 has a support 6 which is fixed to the diamond layer 2 with a brazing layer 5.

EXAMPLE

A surface acoustic wave filter having a structure of FIG. 6 was prepared and its filtering property measured.

The diamond layer 2 having a thickness of 40 $\mu$m was formed on a single crystal silicon substrate having a surface roughness ($R_{max}$) of 0.01 $\mu$m (a radius of 50 mm) by a thermal filament CVD method, which is disclosed, for example, in Japanese Patent Kokai Publication No. 9110/1983 under the following growing conditions:

Raw material gases: $CH_4/H_2 = 1/100$
Substrate temperature: 830° C.
Reaction pressure: 50 Torr.

The silicon substrate was dissolved and removed with fluoronitric acid. The diamond layer had a resistivity of $10^{10}$ $\Omega$.m or larger.

On a surface of the diamond layer which was contacted to to the silicon substrate, an aluminum film was vacuum deposited and then two pairs of comb-like electrodes were formed by photolithography. A line width of the electrode was 2 $\mu$m ($\lambda = 8$ $\mu$m) and the number of tip pairs was 25.

On the surface of the diamond layer having the comb-like electrodes, a ZnO. film was formed by an RF magnetron sputtering method under the following conditions:

Substrate temperature: 400° C.
Sputtering gases: $Ar/O_2 = 1/1$
RF power: 250 W
Pressure: 0.02 Torr.

By controlling a sputtering time, the ZnO film having a thickness of 2.5 $\mu$m was formed. The ZnO film had the $\alpha$ value of 2.2, which means a good orientation in the c-axis, and a resistivity of $10^8$ $\Omega$.cm.

The maximum resonance frequency of the produced surface acoustic wave filter was 1.1 GHz.

What is claimed is:

1. A surface acoustic wave device comprising a diamond layer, a piezoelectric layer and a comb-like electrode, wherein said piezoelectric layer and said comb-like electrode are formed on a surface of said diamond layer, said surface having been in contact with a substrate used in the formation of said diamond layer by a vapor phase growth method, resulting in said surface having a surface roughness of 0.1 $\mu$m or less.

2. The surface acoustic wave device according to claim 1, wherein said diamond layer has a thickness of at least 5 $\mu$m.

3. The surface acoustic wave device according to claim 1, wherein said diamond layer has a resistivity of at least $10^6$ $\Omega$.cm.

4. The surface acoustic wave device according to claim 1, wherein said piezoelectric layer is made of at least one material selected from ZnO, AlN, PZT, PLZT, $SiO_2$, $LiTaO_3$ and $LiNbO_3$.

5. The surface acoustic wave device according to claim 1, wherein said piezoelectric layer has a resistivity of at least $10^4$ $\Omega$.cm.

6. A surface acoustic wave device comprising:
a diamond layer having an exterior surface that has been etched from an adjoining substrate so as to have a surface roughness of 0.1 $\mu$m or less;
a piezoelectric layer on the exterior surface of said diamond layer; and
a comb-like electrode on the exterior surface of said diamond layer.

* * * * *